US006754619B1

United States Patent
Nakatsuyama

(10) Patent No.: US 6,754,619 B1
(45) Date of Patent: Jun. 22, 2004

(54) DIGITAL RECORDING AND PLAYBACK SYSTEM WITH VOICE RECOGNITION CAPABILITY FOR CONCURRENT TEXT GENERATION

(75) Inventor: Takashi Nakatsuyama, LaJolla, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/439,380

(22) Filed: Nov. 15, 1999

(51) Int. Cl.[7] .............................................. G01L 19/00
(52) U.S. Cl. ..................................... 704/201; 704/235
(58) Field of Search ................................ 704/235, 201, 704/231, 270

(56) References Cited

U.S. PATENT DOCUMENTS

| | | | | | |
|---|---|---|---|---|---|
| 4,717,261 A | * | 1/1988 | Kita et al. | ...................... | 365/45 |
| 4,935,954 A | * | 6/1990 | Thompson et al. | ....... | 379/88.04 |
| 4,975,957 A | * | 12/1990 | Ichikawa et al. | ............ | 704/220 |
| 5,031,113 A | | 7/1991 | Hollerbauer | ................. | 704/235 |
| 5,197,052 A | | 3/1993 | Schroder et al. | .......... | 369/25.01 |
| 5,477,511 A | | 12/1995 | Englehardt | ................ | 369/25.01 |
| 5,649,060 A | | 7/1997 | Ellozy et al. | ................ | 704/278 |
| 5,724,410 A | * | 3/1998 | Parvulescu et al. | .......... | 340/313 |
| 5,754,978 A | * | 5/1998 | Perez-Mendez et al. | .... | 704/239 |
| 5,799,273 A | | 8/1998 | Mitchell et al. | ............. | 704/235 |
| 5,809,464 A | | 9/1998 | Kopp et al. | .................. | 704/235 |
| 5,815,196 A | * | 9/1998 | Alshawi | .................... | 348/14.01 |
| 5,857,099 A | | 1/1999 | Mitchell et al. | ............. | 704/235 |
| 5,995,936 A | * | 11/1999 | Brais et al. | ............... | 369/25.01 |
| 6,138,096 A | * | 10/2000 | Chan et al. | .................. | 704/200 |
| 6,151,576 A | * | 11/2000 | Warnock et al. | ............ | 704/235 |
| 6,308,158 B1 | * | 10/2001 | Kuhnen et al. | ............. | 704/235 |

FOREIGN PATENT DOCUMENTS

| | | | | |
|---|---|---|---|---|
| CA | 2227371 A1 | * | 8/1998 | .................. 704/275 |
| EP | 0780777 A1 | | 6/1997 | ........... G06F/17/30 |
| JP | 10 285272 | | 10/1998 | .............. G10L/3/00 |
| WO | WO 97/33220 | | 9/1997 | ............. G06F/3/16 |

* cited by examiner

*Primary Examiner*—Richemond Dorvil
*Assistant Examiner*—Donald L. Storm
(74) *Attorney, Agent, or Firm*—Wagner, Murabito & Hao LLP

(57) ABSTRACT

A digital recording and playback system with built-in voice recognition capability for concurrent text generation. In one embodiment, the system comprises an audio capturing device configured to receive a voice input. The system also comprises a high compression encoder (HCE) coupled to the audio capturing device and configured to generate digital wave data corresponding to the voice input, as well as a voice recognition engine (VRE) coupled to the audio capturing device and configured to generate text data corresponding to the voice input. In this embodiment, the HCE and VRE are selectively coupled to a memory sub-system which is configured to store the digital wave data and the text data. In this embodiment, the VRE performs voice-to-text conversion using the high quality audio input signal rather than highly compressed voice data so that high quality conversion is achieved. In this embodiment, the HCE and the VRE are operable to concurrently generate the digital wave data and the text data in response to the voice input such that the digital wave data and the text data can be stored in the memory sub-system in a synchronized manner. As such, this embodiment of the present invention provides recording capability wherein text data is generated from a voice input without requiring post-recording conversion. In a specific embodiment, the present invention includes the above and wherein the system is battery-powered and is portable.

30 Claims, 4 Drawing Sheets

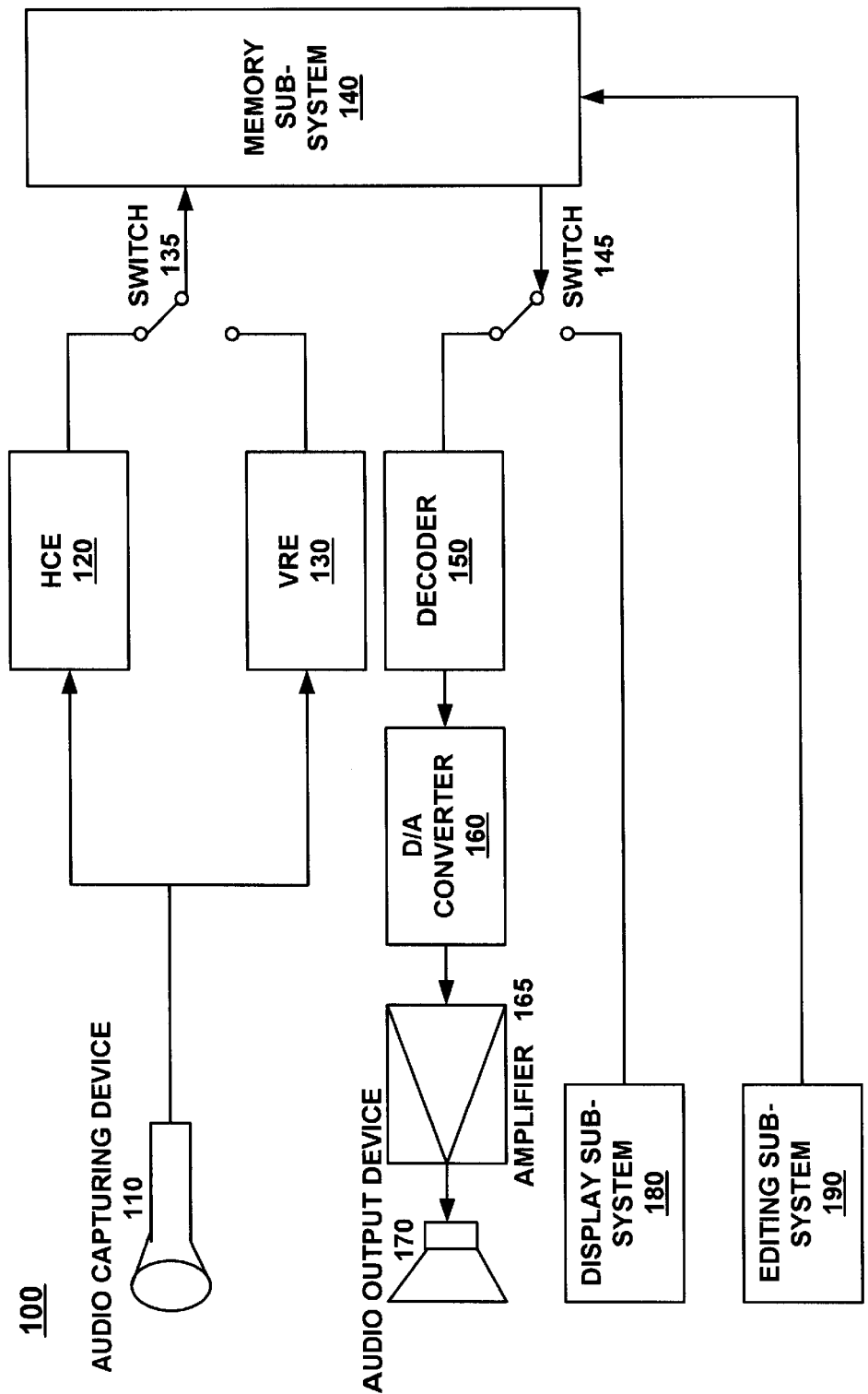

DIGITAL RECORDING AND PLAYBACK SYSTEM WITH VOICE RECOGNITION CAPABILITY FOR CONCURRENT TEXT GENERATION

BACKGROUND OF THE INVENTION

1. Field of the Invention

The present invention relates to the design of digital recording and playback systems. More specifically, the present invention pertains to the processing of voice and concurrent generation of corresponding text in a portable digital appliance.

2. Related Art

The use of portable digital recording and playback devices are quickly gaining popularity in business and among individual users. In particular, one attractive feature of digital recording is the possibility of converting the voice messages into text, which can then be reviewed, revised and incorporated into documents or otherwise retrieved for use subsequently. Today, there are several models of portable digital recorder in the marketplace. These prior art recorders typically record voice messages as compressed digital data. In order to convert the compressed digital data to text data, a separate computer program is generally required. Thus, in the prior art, subsequent to a recording session, the user needs to post-process the compressed digital data to perform the voice-to-text conversion. This requires additional processing time, and in some cases even requires the user to transfer the compressed digital data from the portable device to a personal computer (PC) having the necessary software program before the conversion can be performed. It is desirable to eliminate the extra step of post-recording conversion from compressed digital data to text data in a portable digital recording and playback system.

These prior art devices are not well-suited for generating text data from the recorded voice data for an additional reason. In order to achieve good conversion from voice to text, a high quality voice input to the voice to text conversion engine is needed. In prior art portable systems, the voice data is subject to high compression because portable systems typically have limited memory capacity, and high compression allows more voice data to be stored into the limited memory resources. Since voice data is stored in a highly compressed format in these portable prior art devices, the text data generated directly from the compressed voice data by a conversion program is usually unsatisfactory. As such, it is highly advantageous to have a portable digital recording and playback system which provides high quality conversion from voice to text.

Furthermore, portable devices are typically battery-powered. Thus, the need to conserve power is a major design consideration. As such, while a high capacity stager can potentially be used in a large, non-portable device deriving its power from a power outlet to improve the quality of the conversion from compressed voice data to text data, it is not a viable option in a portable device. Therefore, there exists a need for a portable digital recording and playback system which provides high quality conversion from voice to text and yet does not require a high rate of power consumption.

SUMMARY OF THE INVENTION

In implementing a viable portable digital recording and playback system, it is highly desirable that components that are well known in the art and are compatible with existing computer systems and other appliances be used so that the cost of realizing the portable digital recording and playback system is low. By so doing, the need to incur costly expenditures for retrofitting existing computer systems and other appliances or for building custom components is advantageously eliminated.

Thus, a need exists for a portable digital recording and playback system which does not require post-recording conversion to generate text data from compressed digital data. A further need exists for a portable digital recording and playback system which meets the above need and which provides high quality conversion from voice to text. Still another need exists for a portable digital recording and playback system which meets both of the above needs and which does not require a high level of power consumption. Yet another need exists for a portable digital recording and playback system which meets all of the above needs and which is conducive to use with existing computer systems and other appliances.

Accordingly, the present invention provides a portable digital recording and playback system which generates text data from voice without requiring post-recording conversion from compressed digital data to text data. The present invention further provides a portable digital recording and playback system which not only provides voice to text conversion without post-processing but the conversion is also of high quality. Embodiments of the present invention perform voice-to-text conversion using the high quality audio input signal rather than highly compressed voice data so that high quality conversion is achieved. Moreover, the present invention provides a portable digital recording and playback system which includes the above features and which conserves power for full battery operation. Furthermore, embodiments of the present invention utilize components that are well known in the art and are compatible with existing computer systems and other appliances, so that the present invention is conducive for use with existing computer systems and other appliances. These and other advantages of the present invention not specifically mentioned above will become clear within discussions of the present invention presented herein.

More specifically, in one embodiment of the present invention, a digital recording and playback system is provided. In this embodiment, the system comprises an audio capturing device configured to receive a voice input. The system also comprises a high compression encoder (HCE) coupled to the audio capturing device and configured to generate digital wave data corresponding to the voice input. The system further comprises a voice recognition engine (VRE) coupled to the audio capturing device and configured to generate text data corresponding to the voice input. Moreover, in this embodiment, the HCE and VRE are selectively coupled to a memory sub-system which is configured to store the digital wave data and the text data. In particular, in this embodiment, the HCE and the VRE are operable to concurrently generate the digital wave data and the text data in response to the voice input such that the digital wave data and the text data can be stored in the memory sub-system in a synchronized manner. Thus, in this embodiment, the present invention provides recording capability wherein text data is generated from a voice input without requiring post-recording conversion. In a specific embodiment, the present invention includes the above and wherein the system is battery-powered.

Additional embodiments of the present invention include the above and further comprise a decoder selectively coupled to the memory sub-system and configured to decode the digital wave data into decoded audio data, a digital-to-analog (D/A) converter coupled to the decoder and configured to convert the decoded audio data into an analog signal, and an audio output device coupled to the D/A converter and configured to generate a voice output corresponding to the voice input from the analog signal. Moreover, these embodiments also comprises a display sub-system selectively coupled to the memory sub-system and configured to display the text data. Thus, in these embodiments, the present invention provides simultaneous voice playback and text display.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a block diagram illustrating a portable digital recording and playback system 100 in accordance with one embodiment of the present invention, wherein the system has built-in voice recognition capability for concurrent text generation during voice recording.

DETAILED DESCRIPTION OF THE INVENTION

Figure 2A:
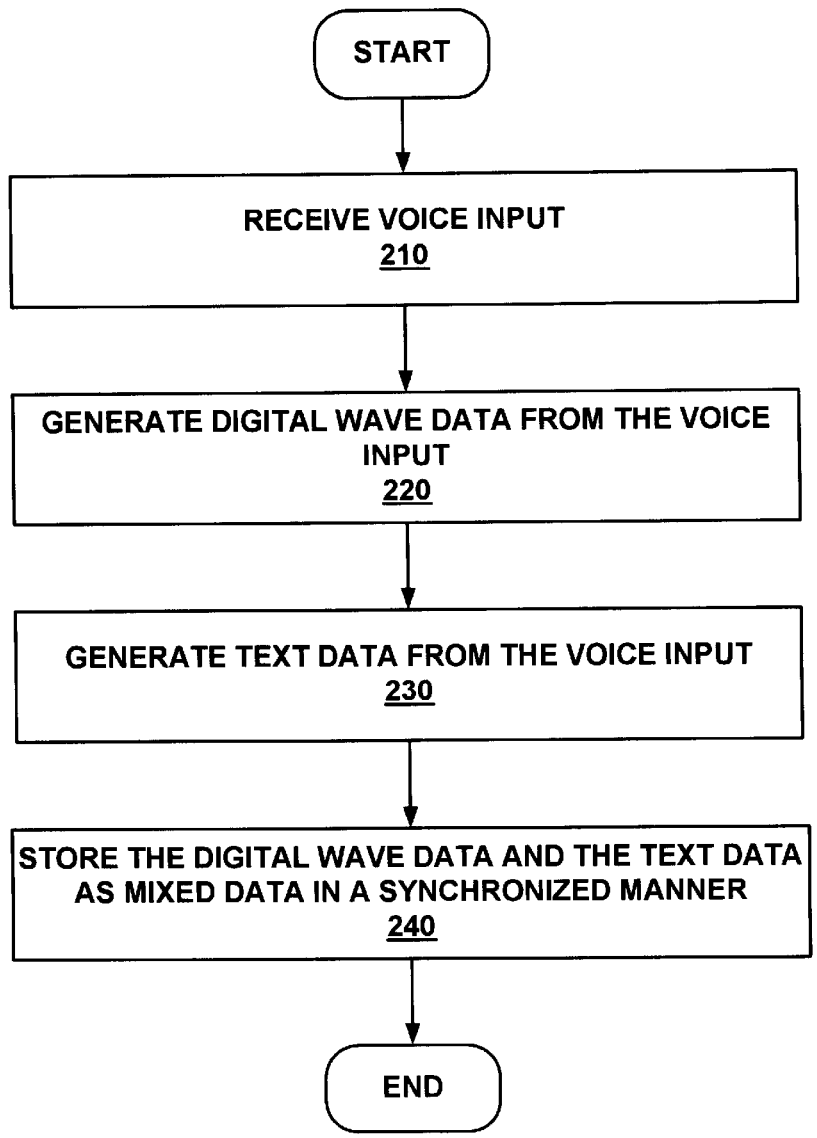
FIG. 2A is a flow diagram illustrating steps for performing recording using system 100 of FIG. 1 in accordance with one embodiment of the present invention.

In the following detailed description of the present invention, a digital recording and playback system with voice recognition capability for concurrent text generation, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Exemplary Configuration of a Digital Recording and Playback System of the Present Invention FIG. 1 is a block diagram illustrating a portable digital recording and playback system 100 in accordance with one embodiment of the present invention, wherein the system has built-in voice recognition capability for concurrent text generation during voice recording. In system 100, an audio capturing device 110 is coupled to a high compression encoder (HCE) 120. Audio, capturing device 110 is also coupled to a voice recognition engine (VRE) 130. Both HCE 120 and VRE 130 are selectively coupled to a memory sub-system 140 through an intelligent switch 135. More particularly, switch 135 is operable to couple either HCE 120 or VRE 130, but not both, to memory sub-system 140 at any given time. In one embodiment, switch 135 is a multiplexer. In another embodiment, switch 135 is a software switch for data routing. In an exemplary embodiment, audio capturing device 110 comprises a microphone. It is appreciated that audio signals are supplied to HCE 120 and VRE 130 simultaneously so that voice encoding and recognition functions can be performed in parallel.

It is appreciated that within the scope of the present invention, memory sub-system 140 can comprise volatile memory (e.g., random access memory RAM), non-volatile memory (e.g., read only memory ROM), and/or data storage devices such as magnetic or optical disk drives and disks (e.g., diskettes, tapes, cartridges) which are computer readable media for storing information and instructions. These memory modules of memory sub-system 140 can be removable to facilitate the easy transfer of data stored therein. In one embodiment, memory sub-system 140 comprises semi-conductor flash memory.

Still referring to FIG. 1, memory sub-system 140 is selectively coupled to both a decoder 150 and a display sub-system 180 through an intelligent switch 145. More particularly, switch 145 is operable to couple memory sub-system 140 to either decoder 150 or display sub-system 180, but not both, at any given time. In one embodiment, switch 145 is a multiplexer. In another embodiment, switch 145 is a software switch. In one embodiment, switch 145 is controlled by the texted voice data generated by VRE 130. Moreover, in an exemplary embodiment, display sub-system 180 comprises flat panel display technology, for example, a liquid crystal display (LCD).

With reference still to FIG. 1, decoder 150 is further coupled to a digital-to-analog (D/A) converter 160. Moreover, D/A converter 160 is coupled to an amplifier 165, which is in turn coupled to an audio output device 170. In one embodiment, audio output device 170 comprises a speaker.

With reference still to FIG. 1, in one embodiment, an editing sub-system 190 is coupled to memory sub-system 140. In this embodiment, editing sub-system 190 can include an alphanumeric input device having alphanumeric and function keys to allow user editing of the text data. Editing sub-system 190 can also include a cursor control or directing device to facilitate text editing and command selection by a user. Cursor control device allows the computer user to dynamically signal the two dimensional movement of a visible symbol (cursor) on a screen of display sub-system 180. Many implementations of cursor control device are known in the art including a trackball, mouse, touch pad, joystick or special keys on the alphanumeric input device capable of signaling movement of a given direction or manner of displacement. Alternatively, it will be appreciated that a cursor can be directed and/or activated via input from the alphanumeric input device using special keys and key sequence commands. The present invention is also well suited to directing a cursor by other means such as, for example, voice commands. Moreover, editing sub-system 190 can further include a printing device for generating paper copies of the text data.

Operation of a Digital Recording and Playback System of the Present Invention

Referring next to FIG. 2A, a flow diagram 200 illustrating steps for performing recording using system 100 of FIG. 1 in accordance with one embodiment of the present invention is shown. In step 210, system 100 receives a voice input using audio capturing device 110.

In step 220, system 100 of FIG. 1 generates digital wave data from the voice input using HCE 120. In an exemplary embodiment, HCE 120 of system 100 can achieve a compression rate of two kilobits per second (2 kbit/s). It is appreciated that the high level of compression of the digital wave data in accordance with the present invention advantageously reduces the amount of memory that is required to store the digital wave data.

In step 230, system 100 of FIG. 1 generates text data from the voice input using VRE 130. In one embodiment, VRE 130 of system 100 uses Hidden Markov Model (HMM) techniques to perform voice recognition, although other voice recognition techniques can also be used within the scope of the present invention. It is also appreciated that the text data can be in any of a wide variety of formats. In an exemplary embodiment, the text data is generated in hypertext markup language (HTML) format.

Referring still to FIG. 2A, in step 240, system 100 of FIG. 1 stores the digital wave data and the text data as mixed data in memory sub-system 140 in a synchronized manner. More specifically, in one embodiment, steps 220 and 230 are performed concurrently and the digital wave data and the text data generated is sent to memory sub-system 140 via switch 135 in alternate fashion such that a particular portion of the digital wave data is correlated with the corresponding portion of the text data as they are being stored as mixed data. In an exemplary embodiment, the present invention employs a buffering mechanism in conjunction with switch 135 to handle timing delays that may arise during the voice recognition process (e.g., digital wave data is generated more quickly by HCE 120 than the corresponding text data is generated by VRE 130) to ensure that corresponding portions of digital wave data and text data is synchronized when it is stored in memory sub-system 140.

Figure 2B:
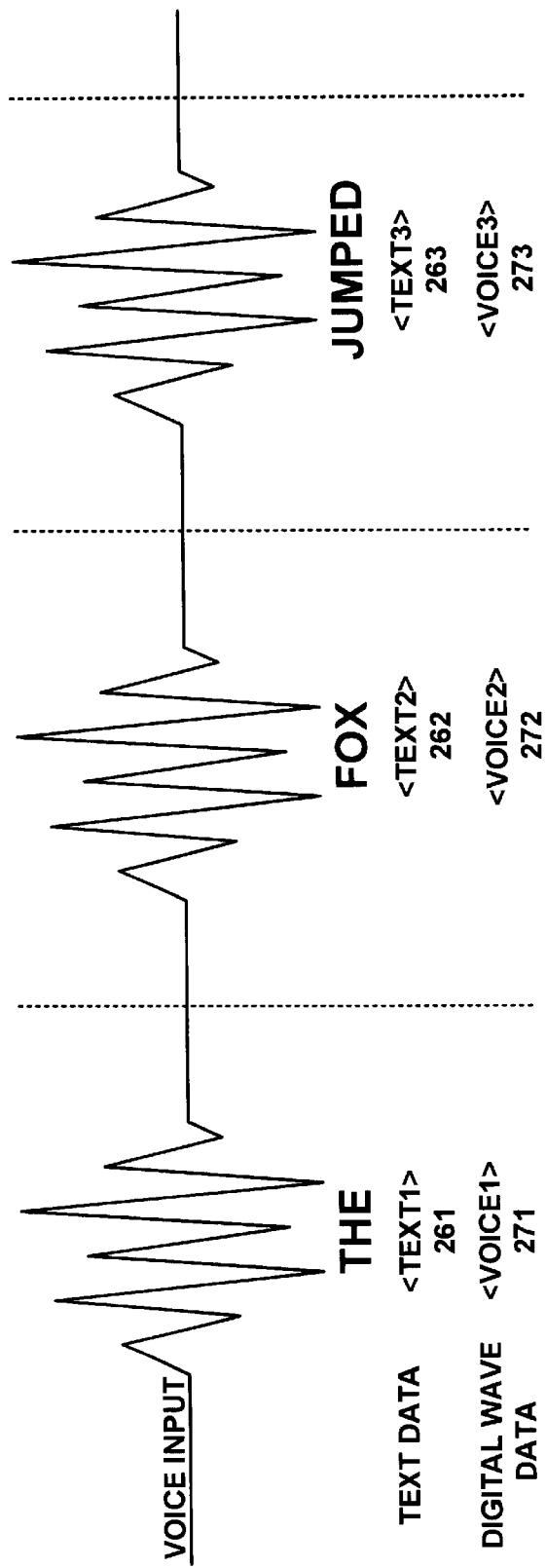
FIG. 2B is a diagram illustrating one embodiment of arrangement of corresponding portions of voice data and text data as stored in a portable digital recording and playback system 100 in accordance with the present invention.

Referring next to FIG. 2B, a diagram illustrating one embodiment of arrangement of corresponding portions of voice data and text data as stored in a portable digital recording and playback system 100 in accordance with the present invention is shown. In an exemplary embodiment as shown in FIG. 2B, a voice input is converted into portions 261, 262 and 263 of digital wave data and corresponding portions 271, 272 and 273 of text data. These portions of digital wave data and text data are then stored in memory sub-system 140 as mixed data such that respective portions of digital wave data and text data are synchronized. More specifically, in one embodiment, the data portions are stored in alternate fashion such that a particular portion of the digital wave data is correlated with the corresponding portion of the text data (e.g., text data portion 261 with digital wave data portion 271; text data portion 262 with digital wave data portion 272; text data portion 263 with digital wave data portion 273.)

As such, the present invention enables subsequent access and retrieval of the stored data to be performed efficiently and conveniently because the text data can be used to search for a desired portion of digital wave data, and vice versa, since the text data and digital wave data is synchronized. In one embodiment, switch 135 is controlled based on phonetic group definitions of the text in the text data.

By performing real-time voice recognition on the voice input to generate text data, embodiments of the present invention eliminate the post-processing that is typically required in prior art systems in order to derive text data from stored voice data. Moreover, since the text data is generated directly from the voice input in the present invention and not from highly compressed voice data as in the prior art, high quality voice-to-text conversion is achieved. In addition, since the present invention does not rely on the stored voice data to generate the text data, the voice input can be subject to high compression and stored as digital wave data in accordance with the present invention to advantageously reduce the amount of memory required for storage without compromising the quality of the text data.

Figure 3:
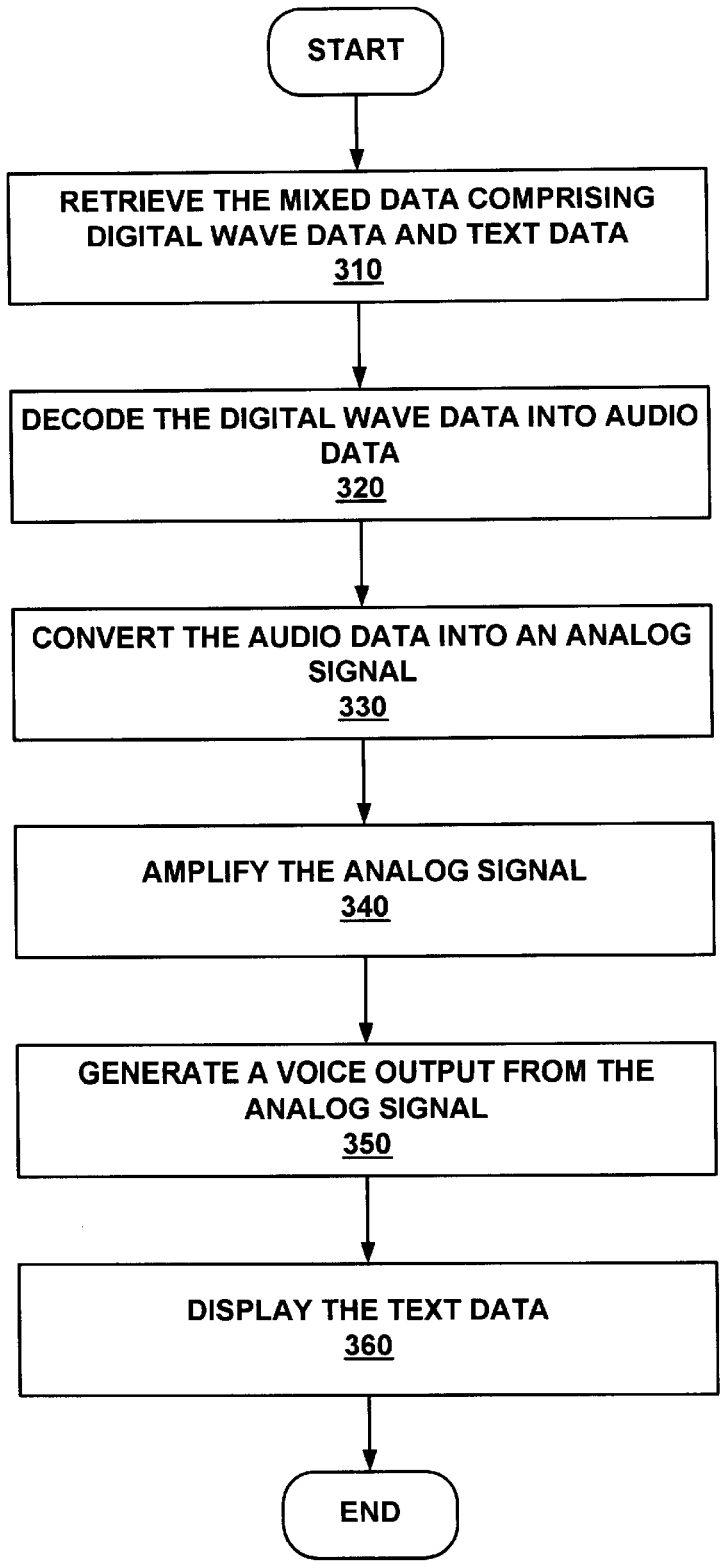
FIG. 3 is a flow diagram illustrating steps for performing playback using system 100 of FIG. 1 in accordance with one embodiment of the present invention.

With reference next to FIG. 3, a flow diagram 300 illustrating steps for performing playback using system 100 of FIG. 1 in accordance with one embodiment of the present invention is shown. In step 310, system 100 of FIG. 1 retrieves the mixed data which comprises digital wave data and text data from memory sub-system 140.

In step 320, system 100 of FIG. 1 decodes the digital wave data into audio data using decoder 150. In step 330, system 100 converts the audio data into an analog signal using D/A converter 160. In optional step 340, in one embodiment, system 100 amplifies the analog signal. In step 350, system 100 generates a voice output corresponding to the voice input from the analog signal.

It is appreciated that the present invention provides a high quality voice output. More specifically, the voice output is based on the recorded voice input (as digital wave data) and is a high fidelity reproduction thereof, and not based on a simulated voice generated using text data.

With reference still to FIG. 3, in step 360, system 100 of FIG. 1 displays the text data using display sub-system 180. More specifically, in one embodiment, the digital wave data and the text data retrieved is sent to decoder 150 and display sub-system 180 via switch 145 in alternate fashion such that output of the digital wave data by audio output device 170 and display of the text data by display sub-system 180 is synchronized. As such, the present invention affords great convenience to the reviewer of the recorded voice and text. In one embodiment, switch 145 is controlled based on phonetic group definitions of the text in the text data.

It is appreciated that embodiments of the present invention can operate for extended periods of time under battery power (e.g., disposable batteries, rechargeable batteries) because components of system 100 (FIG. 1) in accordance with the present invention do not consume power at a high rate. Thus, the present invention provides a digital recording and playback system which is operable under battery power and is portable and wherein high quality text data is generated from a voice input without requiring post-recording conversion.

Moreover, it is appreciated that system 100 of FIG. 1 in accordance with embodiments of the present invention does not require specialized circuit components or extensive retrofitting of existing computer systems and other appliances, because the circuit elements required for its implementation are commonly used in today's electronic appliances and are fully compatible with existing computer systems and other appliances. As such, a portable, battery-powered digital recording and playback system which does not require post-processing to generate high quality text data, and which is conducive to use with existing computer systems and other appliances is provided by the present invention.

It is further appreciated that although exemplary values and operational details (e.g., compression ratio of HCE 120, voice recognition techniques used in VRE 130) for various components are given with respect to embodiments of the present invention described above, such values and details are illustrative only and can vary within the scope and spirit of the present invention.

The preferred embodiment of the present invention, a digital recording and playback system with built-in voice recognition capability for concurrent text generation, is thus described. While the present invention has been described in particular embodiments, it should be appreciated that the present invention should not be construed as limited by such embodiments, but rather construed according to the below claims.

What is claimed is:

1. A digital recording and playback system comprising:
   an audio capturing device configured to receive a voice input;
   a high compression encoder (HCE) coupled to said audio capturing device and configured to generate digital wave data corresponding to said voice input;
   a voice recognition engine (VRE) coupled to said audio capturing device and configured to generate text data from non-compressed data corresponding to said voice input;
   a memory sub-system selectively coupled to said HCE and said VRE and configured to store said digital wave data and said text data; and wherein said HCE and said VRE are operable to concurrently generate said digital wave data and said text data in response to said voice input such that said digital wave data and said text data can be stored in a synchronized manner.

2. The system as recited in claim 1 further comprising a first switch coupled between said HCE and said memory sub-system and also between said VRE and said memory sub-system, said first switch configured to couple one of said HCE and said VRE to said memory sub-system and to simultaneously decouple the other one of said HCE and said VRE from said memory sub-system.

3. The system as recited in claim 2 wherein said first switch is controlled based on said text data.

4. The system as recited in claim 1 further comprising:
   a decoder selectively coupled to said memory sub-system and configured to decode said digital wave data into decoded audio data;
   a digital-to-analog (D/A) converter coupled to said decoder and configured to convert said decoded audio data into an analog signal; and
   an audio output device coupled to said D/A converter and configured to render a voice output corresponding to said voice input from said analog signal.

5. The system as recited in claim 4 further comprising an amplifier coupled between said D/A converter and said audio output device and configured to amplify said analog signal.

6. The system as recited in claim 4 further comprising a display sub-system selectively coupled to said memory sub-system and configured to display said text data.

7. The system as recited in claim 6 further comprising a second switch coupled between said decoder and said memory sub-system and also between said display sub-system and said memory sub-system, said second switch configured to couple one of said decoder and said display sub-system to said memory sub-system and to simultaneously decouple the other one of said decoder and said display sub-system from said memory sub-system.

8. The system as recited in claim 6 wherein said display sub-system comprises a liquid crystal display (LCD).

9. The system as recited in claim 1 wherein said system is portable and battery-powered.

10. The system as recited in claim 1 wherein said memory sub-system comprises semiconductor flash memory.

11. The system as recited in claim 1 wherein said VRE uses Hidden Markov Model (HMM) techniques to perform voice recognition.

12. The system as recited in claim 1 wherein said HCE is operable to achieve a compression rate of two kilobits per second (2 kbit/s).

13. A method for audio recording and playback in a portable device, said method comprising the steps of:
   a) capturing a voice input;
   b) performing high compression encoding on said voice input to generate digital wave data;
   c) performing voice recognition on said voice input to generate text data from non compressed data;
   d) storing said digital wave data and said text data in said portable device; and wherein said steps b) and c) are performed concurrently to generate said digital wave data and said text data in response to said voice input such that said digital wave data and said text data can be stored in a synchronized manner.

14. The method as recited in claim 13 wherein said step d) comprises the step d1) of alternately storing portions of said digital wave data and corresponding portions of said text data such that said digital wave data and said text data is synchronized.

15. The method as recited in claim 14 wherein said step d1) is controlled based on said text data.

16. The method as recited in claim 13 further comprising the steps of:
   e) retrieving said digital wave data from said portable device;
   f) decoding said digital wave data into decoded audio data;
   g) converting said decoded audio data into an analog signal; and
   h) generating a voice output corresponding to said voice input from said analog signal.

17. The method as recited in claim 16 further comprising the step of amplifying said analog signal.

18. The method as recited in claim 16 further comprising the steps of:
   i) retrieving said text data from said portable device; and
   j) displaying said text data.

19. The method as recited in claim 18 wherein said step e) comprises the step of retrieving portions of said digital wave data from said portable device and said step i) comprises the step of retrieving portions of said text data corresponding to said portions of said digital wave data from said portable device, and wherein said steps e) and i) are performed alternately such that said retrieving of said digital wave data and said text data is synchronized.

20. The method as recited in claim 18 wherein said step j) comprises the step of displaying said text data on a liquid crystal display (LCD).

21. The method as recited in claim 13 wherein said portable device is battery-powered.

22. The method as recited in claim 13 wherein said step d) comprises the step of storing said digital wave data and said text data in semiconductor flash memory within said portable device.

23. The method as recited in claim 13 wherein said step c) comprises the step of performing voice recognition on said voice input to generate text data using Hidden Markov Model (HMM) techniques.

24. The method as recited in claim 13 wherein said high compression encoding achieves a compression rate of two kilobits per second (2 kbit/s).

25. A digital recording and playback system comprising:
   an audio capturing means for receiving a voice input;
   a high compression encoding means coupled to said audio capturing means for generating digital wave data corresponding to said voice input;
   a voice recognition means coupled to said audio capturing means for generating text data from non-compressed data corresponding to said voice input; and a storage means selectively coupled to said high compression encoding means and said voice recognition means for storing said digital wave data and said text data, wherein said high compression encoding means and said voice recognition means are operable to concurrently generate said digital wave data and said text data in response to said voice input such that said digital wave data and said text data can be stored in a synchronized manner.

26. The system as recited in claim 25 further comprising a first switching means coupled between said high compression encoding means and said storage means and also between said voice recognition means and said storage means, said first switching means for coupling one of said high compression encoding means and said voice recognition means to said storage means while simultaneously decoupling the other one of said high compression encoding means and said voice recognition means from said storage means.

27. The system as recited in claim 25 further comprising:
   a decoding means selectively coupled to said storage means for decoding said digital wave data into decoded audio data;
   a digital-to-analog (D/A) converting means coupled to said decoding means for converting said decoded audio data into an analog signal; and
   an audio output means coupled to said D/A converting means for generating a voice output corresponding to said voice input from said analog signal.

28. The system as recited in claim 27 further comprising an amplifying means coupled between said D/A converting means and said audio output means for amplifying said analog signal.

29. The system as recited in claim 27 further comprising a display means selectively coupled to said storage means for displaying said text data.

30. The system as recited in claim 29 further comprising a second switching means coupled between said decoding means and said storage means and also between said display means and said storage means, said second switch for coupling one of said decoding means and said display means to said storage means while simultaneously decoupling the other one of said decoding means and said display means from said storage means.

* * * * *

Disclaimer 6,754,619 B1—Takashi Nakatsuyama, LaJolla, CA (US); DIGITAL RECORDING AND PLAYBACK SYSTEM WITH VOICE RECOGNITION CAPABILITY FOR CONCURRENT TEXT GENERATION. Patent Dated June 22, 2004, disclaimer filed May 20, 2005 by Assignee, Sony Electronics, Inc.

The term of this patent shall not extend beyond the expiration date of Patent No. 6,754,619.

(*Official Gazette October 3, 2006*)